(12) United States Patent
Oda et al.

(10) Patent No.: US 8,173,093 B2
(45) Date of Patent: May 8, 2012

(54) IRON SILICIDE SPUTTERING TARGET AND METHOD FOR PRODUCTION THEREOF

(75) Inventors: Kunihiro Oda, Ibaraki (JP); Ryo Suzuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1766 days.

(21) Appl. No.: 10/527,320

(22) PCT Filed: Sep. 1, 2003

(86) PCT No.: PCT/JP03/11152
§ 371 (c)(1),
(2), (4) Date: Mar. 7, 2005

(87) PCT Pub. No.: WO2004/024977
PCT Pub. Date: Mar. 25, 2004

(65) Prior Publication Data
US 2006/0057014 A1    Mar. 16, 2006

(30) Foreign Application Priority Data

Sep. 11, 2002   (JP) ............................. 2002-265447

(51) Int. Cl.
| | |
|---|---|
| B22F 1/00 | (2006.01) |
| B22F 1/02 | (2006.01) |
| C22C 1/04 | (2006.01) |
| C22C 29/12 | (2006.01) |
| H01F 1/00 | (2006.01) |
| C01B 21/068 | (2006.01) |
| C01B 33/06 | (2006.01) |
| H01L 21/44 | (2006.01) |

(52) U.S. Cl. .......... 423/344; 75/232; 148/306; 148/307; 148/309; 250/492.2; 419/33; 419/48; 438/682; 438/683

(58) Field of Classification Search .......... 148/306–309; 419/33, 48; 423/344; 75/232; 250/492.2; 438/682, 683
See application file for complete search history.

(56) References Cited

U.S. PATENT DOCUMENTS

| 3,749,658 | A | * | 7/1973 | Vossen ..................... 204/192.29 |
| 4,487,627 | A | | 12/1984 | Umemura et al. |
| 5,460,793 | A | | 10/1995 | Kano et al. |
| 5,780,755 | A | * | 7/1998 | Dunlop et al. ................ 75/249 |
| 6,582,535 | B1 | | 6/2003 | Suzuki et al. |
| 6,723,183 | B2 | | 4/2004 | Oda et al. ..................... 148/421 |
| 7,217,310 | B2 | | 5/2007 | Yahagi et al. |
| 7,347,969 | B2 | | 3/2008 | Yahagi et al. |
| 2003/0155229 | A1 | | 8/2003 | Irumata et al. ........... 204/192.23 |
| 2004/0170552 | A1 | | 9/2004 | Irumata et al. ................ 423/344 |
| 2004/0195094 | A1 | | 10/2004 | Irumata et al. ........... 204/298.13 |
| 2006/0002838 | A1 | * | 1/2006 | Oda et al. ...................... 423/344 |
| 2006/0057014 | A1 | * | 3/2006 | Oda et al. ........................ 419/33 |
| 2007/0231180 | A1 | | 10/2007 | Imori et al. |
| 2007/0292298 | A1 | | 12/2007 | Imori et al. |
| 2008/0138642 | A1 | | 6/2008 | Yahagi et al. |

FOREIGN PATENT DOCUMENTS

| JP | 63-227771 | | 9/1988 |
| JP | 63-238265 | | 10/1988 |
| JP | 63-238265 | A | 10/1988 |
| JP | 05-125523 | | 5/1993 |
| JP | 08-104981 | | 4/1996 |
| JP | 09-020512 | A | 1/1997 |
| JP | 10-110264 | | 4/1998 |
| JP | 10110264 | A * | 4/1998 |
| JP | 10-237671 | A | 9/1998 |
| JP | 10-259432 | | 9/1998 |
| JP | 10317086 | A * | 12/1998 |
| JP | 2000-178713 | | 6/2000 |
| JP | 2000178713 | A * | 6/2000 |
| JP | 2001-274098 | A | 10/2001 |

OTHER PUBLICATIONS

ESPI Corp. High Purity Iron, 2002.*
esp@cenet database, 1 page English Abstract of JP 10-012933, Jan. 1998.
esp@cenet database, 1 page English Abstract of JP 2000-160157, Jun. 2000.
esp@cenet database, 1 page English Abstract of JP 07-162041, Jun. 1995.
esp@cenet database, 1 page English Abstract of JP 06-081076, Mar. 1994.
esp@cenet database, 1 page English Abstract of JP 05-283751, Oct. 1993.
Co-pending U.S. Appl. No. 10/527,319, filed Mar. 7, 2005.
Brooker et al., "A New Nitride Precipitate in Iron-Silicon Alloys", Nature, vol. 184, pp. 1311-1312, Oct. 24, 1959.
Johannesson et al., "The Kinetics of the Phase Transition in Ferrosilicon System", Mossbauer Spectroscopy in Material Science, pp. 13-15, 1999.

* cited by examiner

Primary Examiner — Jerry Lorengo
Assistant Examiner — Jennifer Smith
(74) Attorney, Agent, or Firm — Howson & Howson LLP

(57) ABSTRACT

Provided is an iron silicide sputtering target in which the oxygen as the gas component in the target is 1000 ppm or less, and a manufacturing method of such iron silicide sputtering target including the steps of melting/casting high purity iron and silicon under high vacuum to prepare an alloy ingot, subjecting the ingot to gas atomization with inert gas to prepare fine powder, and thereafter sintering the fine powder. With this iron silicide sputtering target, the amount of impurities will be reduced, the thickness of the βFeSi$_2$ film during deposition can be made thick, the generation of particles will be reduced, a uniform and homogenous film composition can be yielded, and the sputtering characteristics will be favorable. The foregoing manufacturing method is able to stably produce this target.

18 Claims, No Drawings

IRON SILICIDE SPUTTERING TARGET AND METHOD FOR PRODUCTION THEREOF

BACKGROUND OF THE INVENTION

The present invention relates to an iron silicide sputtering target having transition-type semiconductor characteristics and suitable for forming a βFeSi$_2$ thin film to be used as an optical communication element or solar battery material, and the manufacturing method of such iron silicide sputtering target.

Although silicon has been the most popular material conventionally as the LSI semiconductor material, a compound semiconductor of indium/phosphorus, gallium/arsenic or the like is being used for optical communication (LE/LED).

Nevertheless, indium has an extremely short life span as a resource, and it is said that it can only be mined for another 20 years or so. Further, arsenic is well known as an element having strong toxicity. Thus, there is no choice but to say that the optical communication semiconductor materials being widely used today have significant problems for use.

In particular, the semiconductor element of gallium/arsenic being used in cell phones with a short product-life cycle includes arsenic having strong toxicity, and this is causing a significant problem regarding the waste disposal thereof.

Under the foregoing circumstances, it has been discovered that βFeSi$_2$ possesses transition-type semiconductor characteristics, and is being noted as a favorable optical communication element and solar battery material. The greatest advantage of this βFeSi$_2$ is that the respective constituent elements are extremely abundant on earth, and that there is no danger of toxicity or the like. Thus, these materials are known as environmentally friendly materials.

Nevertheless, this βFeSi$_2$ is not free of problems, and, at present, technology for preparing high-quality material comparable to compound semiconductors of indium/phosphorus, gallium/arsenic or the like has not yet been established.

Currently, as technology for forming an FeSi$_2$ thin film, proposed is technology for forming βFeSi$_2$ by sputtering an Fe target and forming an Fe film on a Si substrate, and thereafter generating a silicide formation reaction between Si as the substrate material and the Fe film by heating the deposited Si substrate.

Nevertheless, there are problems in that, with this method, since the substrate needs to be heated at a high temperature for a long period during deposition and during annealing, there will be limitations on the device design, and that it is difficult to form a thick βFeSi$_2$ film since the silicide formation reaction is based on the diffusion of Si from the substrate.

As a method similar to the above, proposed is a method of accumulating Fe on the Si substrate while maintaining the substrate at a temperature in which Fe and Si will react; that is, at 470° C., but this method also encounters problems similar to those described above.

Further, as another method, proposed is a method for forming a βFeSi$_2$ film by separately sputtering the Fe target and Si target; that is, performing co-sputtering so as to laminate several layers of the Fe layer and Si layer, and heating this to generate a silicide formation reaction.

Nevertheless, with this method, there are problems in that the sputtering process will become complex, and that it is difficult to control the uniformity of the thickness direction of the film.

Each of the foregoing methods is based on the premise of performing annealing after depositing Fe on the Si substrate, and, with these methods that require heating at high temperatures for a long period, a problem has been noted in that the βFeSi$_2$, which was formed in a film shape, becomes aggregated into an island shape together with the progress of annealing.

Further, with the foregoing methods, since the Fe target is a ferromagnetic body, it is difficult to perform magnetron sputtering, and it is thereby difficult to form an even film on a large substrate. Therefore, an even βFeSi$_2$ film with few variations in the composition resulting from the subsequent silicide formation could not be obtained.

Moreover, although a proposal of a target (mosaic target) in which Fe and Si blocks are disposed in a prescribed area ratio has also been made, since the sputtering rate of Fe or Si, whichever is sputtered, will differ considerably, it is difficult to deposit a prescribed film composition on a large substrate, and it was not possible to prevent the arcing or generation of particles at the bonding interface of Fe and Si.

Conventionally, as technology employing FeSi$_2$, technology relating to the manufacturing method of a thermoelectric material including the steps of forming capsule particles by covering the nuclear particles of FeSi particles with Si particles of a prescribed weight ratio, performing current-conduction sintering to the powder aggregate of the capsule particles, and generating an FeSi$_2$ intermetallic compound has been disclosed (e.g., refer to Japanese Patent Laid-Open Publication No. H5-283751).

Further, a manufacturing method of βFeSi$_2$ including a step of pulverizing and mixing raw material powder containing Fe powder and Si powder, a step of molding the pulverized and mixed powder, and a step of sintering the molded material has been disclosed (e.g., refer to Japanese Patent Laid-Open Publication No. H6-81076).

Moreover, a manufacturing method of iron silicide thermoelectric material including the steps of mixing ferrosilicon and iron powder, and subsequently performing pressure sintering thereto at a sintering temperature of 900 to 1100° C. under an inert atmosphere has been disclosed (e.g., refer to Japanese Patent Laid-Open Publication No. H7-162041).

Further, a manufacturing method of raw material powder for an FeSi$_2$ thermoelectric conversion element including the steps of mixing a prescribed amount of transition metal powder to fine powder obtained via jet mill pulverization with inert gas so as to easily obtain fine powder having a low residual oxygen content and an average grain size of several μm or less, performing spray granulation thereto with a spray dryer, and subsequently performing pressing and sintering thereto has been disclosed (e.g., refer to Japanese Patent Laid-Open Publication No. H10-12933).

Moreover, a metallic silicide luminescent material in which a β-iron silicide semiconductor element, which is a metallic silicide semiconductor particle having a grain size on the order of nanometers, is dispersed in a particle shape in the polycrystalline silicon has been disclosed (e.g., refer to Japanese Patent Laid-Open Publication No. 2000-160157).

SUMMARY OF THE INVENTION

The present invention was devised in order to overcome the foregoing problems, and an object thereof is to provide an iron silicide sputtering target in which the amount of impurities will be reduced, the thickness of the βFeSi$_2$ film during deposition can be made thick, the generation of particles will be reduced, a uniform and homogenous film composition can be yielded, and the sputtering characteristics will be favorable, as well as the method of stably manufacturing such an iron silicide sputtering target.

The present invention provides:
1. An iron silicide sputtering target, wherein the content of oxygen as the gas component in the target is 1000 ppm or less;
2. An iron silicide sputtering target according to paragraph 1 above, wherein the content of oxygen as the gas component in the target is 600 ppm or less;
3. An iron silicide sputtering target according to paragraph 2 above, wherein the content of oxygen as the gas component in the target is 150 ppm or less;
4. An iron silicide sputtering target according to any one of paragraphs 1 to 3 above, wherein the content of carbon as the gas component in the target is 50 ppm or less, the content of nitrogen as the gas component in the target is 50 ppm or less, the content of hydrogen as the gas component in the target is 50 ppm or less, and the content of sulfur as the gas component in the target is 50 ppm or less;
5. An iron silicide sputtering target according to any one of paragraphs 1 to 4 above, wherein the relative density of the target is 90% or more;
6. An iron silicide sputtering target according paragraph 5 above, wherein the relative density of the target is 95% or more;
7. An iron silicide sputtering target according to any one of paragraphs 1 to 6 above, wherein the average crystal grain size of the target texture is 300 μm or less;
8. An iron silicide sputtering target according to paragraph 7 above, wherein the average crystal grain size of the target texture is 150 μm or less;
9. An iron silicide sputtering target according to paragraph 8 above, wherein the average crystal grain size of the target texture is 75 μm or less; and
10. An iron silicide sputtering target according to any one of paragraphs 1 to 9 above, wherein the target texture is substantially a $\zeta_\alpha$ phase, or the primary phase is a $\zeta_\alpha$ phase.

The present invention also provides:
11. A manufacturing method of an iron silicide sputtering target, including the steps of melting/casting high purity iron and silicon under high vacuum to prepare an alloy ingot, subjecting the ingot to gas atomization with inert gas to prepare fine powder, and thereafter sintering the fine powder;
12. A manufacturing method of an iron silicide sputtering target according to any one of paragraphs 1 to 10 above, including the steps of melting/casting high purity iron and silicon under high vacuum to prepare an alloy ingot, subjecting the ingot to gas atomization with inert gas to prepare fine powder, and thereafter sintering the fine powder;
13. A manufacturing method of an iron silicide sputtering target according to paragraph 11 or paragraph 12 above, wherein the high purity iron and silicon are melted with the cold crucible melting method employing a water-cooled copper crucible;
14. A manufacturing method of an iron silicide sputtering target according to any one of paragraphs 11 to 13 above, wherein the fine powder is sintered via hot pressing, hot isostatic pressing or spark plasma sintering; and
15. A manufacturing method of an iron silicide sputtering target according to any one of paragraphs 11 to 14 above, wherein [the fine powder] is heated under a hydrogen atmosphere and subject to decarbonization/deoxidization processing, subject to degasification processing under a vacuum atmosphere, and thereafter sintered.

DETAILED DESCRIPTION OF THE INVENTION

Although the iron silicide sputtering target of the present invention is represented with the molecular formula of $FeSi_2$ unless otherwise specified, this includes the scope of FeSix (x: 1.5 to 2.5).

Further, the iron silicide sputtering target used in this description means every type of iron silicide comprising the property of semiconductors, and iron silicide containing iron silicide as its primary component and small amounts of other additive elements, and the present invention covers all of the above.

With the iron silicide sputtering target of the present invention, the content of oxygen as the gas component is 1000 ppm or less, preferably 600 ppm or less, and more preferably 150 ppm or less. As a result, the generation of particles during sputtering can be suppressed, and a uniform and homogenous film composition can be yielded.

Further, from the perspective of similar characteristic, it is desirable that the content of carbon as the gas component in the target is 50 ppm or less, the content of nitrogen as the gas component in the target is 50 ppm or less, the content of hydrogen as the gas component in the target is 50 ppm or less, and the content of sulfur as the gas component in the target is 50 ppm or less. Incidentally, a gas component means the element detected in a gas state upon performing quantitative analysis.

Moreover, when the relative density of the target is 90% or more, preferably 95% or more, and the average crystal grain size of the target texture is 300 μm or less, preferably 150 μm or less, and more preferably 75 μm or less, arcing and generation of particles can be further suppressed, and a film having stable characteristics can be obtained thereby.

When the iron silicide target texture is substantially a $\zeta_\alpha$ phase, or the primary phase is a $\zeta_\alpha$ phase; that is, when the phase transformation to the β phase (semiconductor phase) is suppressed and the $\zeta_\alpha$ phase still remains, a stable bias current can be applied to the target, and plasma density can be increased easily, and the sputtering gas pressure can be kept low. As a result, a superior effect is yielded in that a favorable film with few gas damages can be obtained.

Upon manufacturing the iron silicide sputtering target of the present invention, high purity iron of 3N5 (99.95 wt %, hereinafter the same) or more, preferably 4N or more, and more preferably 4N5 or more, and silicon of 5N or more are used as the raw materials.

These are melted/cast under high vacuum to prepare an alloy ingot, these are melted once again and then subject to gas atomization with inert gas to prepare fine powder, and this fine powder is sintered to form a sintered body, and this is manufactured into a target to obtain the iron silicide sputtering target.

Upon melting the high purity iron and silicon, it is desirable to perform this with the cold-crucible melting method employing a copper water-cooled crucible. With this cold-crucible melting method, in comparison to the ordinarily adopted vacuum induction melting method employing an aluminum crucible, the oxidization of the raw materials and mixing of impurities from the crucible can be suppressed, and an ingot having a uniform composition can be obtained.

When pulverizing the obtained ingot, in comparison to mechanical pulverizing methods employing a stamp mill or ball mill, since the atomization method employing inert gas is able to rapidly cool, solidify and pulverize the ingot, spherical fine powder with minimal contamination (particularly oxidization) and favorable degree of sintering can be obtained. According to the above, fine powder with a high residual ratio of $\zeta_\alpha$ (also referred to as the $\alpha Fe_2Si_5$ phase or $\alpha FeSi_2$ phase) (metallic phase) can be obtained.

The obtained fine powder is sintered via hot pressing, hot isostatic pressing or spark plasma sintering. Upon sintering, spark plasma sintering is particularly desirable. According to this spark plasma sintering method, the growth of crystal grains can be suppressed, and a high density, high strength target can be sintered. Further, since sintering can be performed in a short period and this can be cooled rapidly, the phase transformation to the β phase (semiconductor phase) can be suppressed, and a target having a high residual ratio of the $\zeta_\alpha$ phase (metallic phase) can be obtained. If different phases exist in the target, the rate of sputtering will differ, and this is not preferable since this will cause the generation of particles.

Predominately, when a single phase $\zeta_\alpha$ phase (metallic phase) is used, a stable bias current can be applied to the target, plasma density can be increased easily, and the sputtering gas pressure can be kept low. Thus, a favorable film with few gas damages can be obtained.

Further, prior to sintering, it is preferable to heat [the fine powder] under a hydrogen atmosphere, perform decarbonization/deoxidization processing thereto, and further perform degasification processing thereto under a vacuum atmosphere. As a result, it is possible to obtain a sputtering target in which the gas components can be eliminated, the generation of particles will be reduced, a uniform and homogenous film composition can be yielded, and the sputtering characteristics will be favorable.

EXAMPLES AND COMPARATIVE EXAMPLES

The present invention is now explained in detail with reference to the Examples and Comparative Examples. These Examples are merely illustrative, and the present invention shall in no way be limited thereby. In other words, the present invention shall only be limited by the scope of claim for a patent, and shall include the various modifications other than the Examples of this invention.

Examples 1 to 3

High purity Fe having a purity of 3N5 to 5N and high purity Si having a purity of 5N in block shapes were weighed at a prescribed molar ratio, these were melted at 1250 to 1600° C. with a cold-crucible melting unit employing a water-cooled copper crucible (vacuuming was sufficiently performed until the ultimate vacuum prior to heating reached an order of $10^{-5}$ torr), and then cast in a mold in a vacuum to prepare an ingot. Upon melting, after foremost melting Fe, Si was gradually added to the Fe molten metal and sufficiently alloyed. Moreover, these were also alloyed with a vacuum induction melting unit employing a high purity alumina crucible and an arc melting unit.

The ingot obtained pursuant to the above was melted once again, and this was atomized in argon gas (gauge pressure of 50 to 80 kgf/cm²) with a gas atomization device to prepare spherical alloy powder having a diameter of 300 μm or less.

Powder of a prescribed grain size was sieved from such spherical alloy powder, and sintered for 2 hours in a vacuum atmosphere with hot pressing at 1000 to 1220° C. and a surface pressure of 250 to 300 kgf/cm². The surface of the obtained sintered body was ground with a flat-surface grinding machine to remove the contamination layer on the surface thereof, and an iron silicide target of φ300 mm×5 mm was prepared thereby.

The raw material purity, composition (Fe:Si) ratio, dissolution method, pulverization method, sieved grain size, and sintering method of Examples 1 to 3 are respectively shown in Table 1.

TABLE 1

| | Raw Material Purity | Fe:Si Ratio | Dissolution Method | Pulverization Method | Sieved Grain Size | Sintering Method |
|---|---|---|---|---|---|---|
| Example 1 | Fe(3N5) | 1:2.2 | Cold Crucible | Ar Gas Atomization | Ave. 30 μm | HP |
| Example 2 | Fe(3N5) | 1:1.8 | VIM | Ar Gas Atomization | Ave. 31 μm | HP |
| Example 3 | Fe(4N) | 1:2.5 | Arc Melting | Ar Gas Atomization | Ave. 35 μm | HP |
| Example 4 | Fe(4N) | 1:2.2 | Cold Crucible | Ar Gas Atomization | Ave. 33 μm | HIP |
| Example 5 | Fe(5N) | 1:2.0 | Cold Crucible | Ar Gas Atomization | Ave. 18 μm | HIP |
| Example 6 | Fe(4N) | 1:1.8 | Cold Crucible | Ar Gas Atomization | Ave. 35 μm | SPS |
| Example 7 | Fe(5N) | 1:1.5 | Cold Crucible | Ar Gas Atomization | Ave. 28 μm | SPS |
| Example 8 | Fe(4N) | 1:2.05 | Cold Crucible | Ar Gas Atomization | Ave. 45 μm | HP (w/deoxidization and heat treatment) |
| Example 9 | Fe(5N) | 1:2.5 | Cold Crucible | Ar Gas Atomization | Ave. 120 μm | HP (w/deoxidization and heat treatment) |
| Example 10 | Fe(5N) | 1:2.01 | Cold Crucible | — | — | HIP |
| Comparative Example 1 | Fe(3N5) | 1:1.6 | VIM | Ball Mill | Ave. 10 μm | HP |
| Comparative Example 2 | Fe(3N5) | 1:1.6 | VIM | Ball Mill | Ave. 16 μm | HP |
| Comparative Example 3 | Fe(4N) | 1:2.3 | VIM | Ar Gas Atomization | Ave. 160 μm | HIP |
| Comparative Example 4 | Fe(3N5) | 1:2.0 | Arc Melting | Ball Mill | Ave. 12 μm | HIP |
| Comparative Example 5 | Fe(4N) | 1:2.0 | Arc Melting | Ball Mill | Ave. 10 μm | SPS |

HP: Hot Pressing
HIP: Hot Isostatic Pressing
SPS: Spark Plasma Sintering
VIM: Vacuum Induction Melting

Examples 4 and 5

Hot isostatic pressing was used as the sintering method. The other conditions were the same as Examples 1 to 3.

As the specific conditions of hot isostatic pressing, the foregoing powder was vacuum-encapsulated in a soft steel container, and sintered for 3 hours at 1150° C. at an atmospheric pressure of 1500. The surface of the obtained sintered body was ground with a flat-surface grinding machine to remove the contamination layer on the surface thereof, and an iron silicide target of φ300 mm×5 mm was prepared thereby.

Details regarding the raw material purity, composition (Fe:Si) ratio, dissolution method, pulverizing method, sieved grain size, and sintering method of Examples 4 and 5 are respectively shown in Table 1.

Examples 6 and 7

Spark plasma sintering was used as the sintering method. The other conditions were the same as Examples 1 to 3. Details regarding the raw material purity, composition (Fe:Si) ratio, dissolution method, pulverizing method, sieved grain size, and sintering method of Examples 6 and 7 are respectively shown in Table 1.

As the specific conditions of spark plasma sintering, the raw material powder shown in Table 1 was filled inside a graphite mold and sintered for 5 minutes with a pulse current of 8000 A. As a result of employing the spark plasma sintering method, high density plasma will be generated at the contact site of the filled particles, and rapid sintering was enabled.

The surface of the obtained sintered body was ground with a flat-surface grinding machine to remove the contamination layer on the surface thereof, and an iron silicide target of φ125 mm×5 mm was prepared thereby.

Examples 8 and 9

In these Examples, other than the temporary sintered body being subject to hydrogen processing→vacuum processing, the other conditions were the same as Example 1 to 3. Details regarding the raw material purity, composition (Fe:Si) ratio, dissolution method, pulverizing method, sieved grain size, and sintering method of Examples 8 and 9 are respectively shown in Table 1.

A temporary sintered body with a density of 70 to 90% and having open pores was prepared with hot pressing at a sintering temperature of 700 to 1000° C., heat treatment was performed to this temporary sintered body in a hydrogen gas stream at 900° C. for 5 hours, decarbonization and deoxidization processing was further performed thereto, and degasification was subsequently performed via heat treatment in a vacuum atmosphere (order of $10^{-4}$ torr).

Next, this temporary sintered body was sintered with hot pressing. The surface of the obtained sintered body was ground with a flat-surface grinding machine to remove the contamination layer on the surface thereof, and an iron silicide target of φ300 mm×5 mm was prepared thereby.

Example 10

This Examples does not use pulverized powder, and obtains a target material by slicing the vacuum-melted ingot, and subject this to heat treatment. The other conditions were the same as Examples 1 to 3. Details regarding the raw material purity, composition (Fe:Si) ratio, dissolution method, and sintering method of Example 10 are respectively shown in Table 1.

After preparing a cast ingot under the same conditions as Examples 1 to 3, this ingot was cut with a wire saw, further subject to hot isostatic pressing at 1050° C. and an atmospheric pressure of 1500 so as to reduce the cast defects, and the surface of the obtained sintered body was ground with a flat-surface grinding machine as with the foregoing Examples to remove the contamination layer on the surface thereof, and an iron silicide target of φ150 mm×5 mm was prepared thereby.

Comparative Examples 1 to 3

High purity Fe having a purity of 3N5 to 5N and high purity Si having a purity of 5N in block shapes were weighed at a prescribed molar ratio, these were melted at 1250 to 1600° C. with a high purity alumina crucible and vacuum induction melting unit. Upon melting, after foremost melting Fe, Si was gradually added to the Fe molten metal and sufficiently alloyed.

After melting, this was cast in a mold in a vacuum to prepare an ingot. Next, the ingot was cut, roughly pulverized to be approximately 1 mm or less with a stamp mill, and then pulverized for 10 hours with a ball mill.

Upon pulverization, the cylindrical column (diameter of roughly 10 mm, length of 15 mm) of high purity Fe was filled up to ⅓ of the inner volume of the ball mill to become the grinding medium, and, after placing the roughly pulverized ingot therein, argon gas was substituted within the mill to prevent oxidization.

Powder of a prescribed grain size was sieved from such spherical alloy powder, and sintered for 2 hours with hot pressing at 1000 to 1220° C. and a surface pressure of 250 to 300 kgf/cm².

The surface of the obtained sintered body was ground with a flat-surface grinding machine to remove the contamination layer on the surface thereof, and an iron silicide target of φ300 mm×5 mm was prepared thereby.

The raw material purity, composition (Fe:Si) ratio, dissolution method, pulverizing method, sieved grain size, and sintering method of Comparative Examples 1 to 3 are respectively shown in Table 1.

Comparative Examples 4 and 5

Other than employing the arc melting method for preparing the ingot, the target was manufactured under the same conditions as Comparative Examples 1 to 3.

The surface of the obtained sintered body was ground with a flat-surface grinding machine to remove the contamination layer on the surface thereof, and an iron silicide target of φ300 mm×5 mm was prepared thereby. The raw material purity, composition (Fe:Si) ratio, dissolution method, pulverizing method, sieved grain size, and sintering method of Comparative Examples 4 and 5 are respectively shown in Table 1.

The oxygen analysis results of the targets of Example 1 to 10, and Comparative Examples 1 to 5 are shown in Table 2, and regarding Examples 1, 5 and 10, the analysis results of other impurities are shown in Table 3.

Further, texture of the target was observed at 17 locations radially, and the average crystal grain size was calculated with the section method from the texture photograph. Moreover, the density was measured with the Archimedes method, and the crystal structure was further examined with XRD. The results are shown in Table 2.

In addition, the targets of Example 1 to 10, and Comparative Example 1 to 5 were used to perform DC magnetron sputtering on a 3-inch Si (100) substrate so as to evaluate the sputtering characteristics and film characteristics of the target. The results are similarly shown in Table 2.

TABLE 2

| | Oxygen (ppm) | Relative Density (%) | Average Grain Size | Uniformity (3σ) | Particles Quantity/cm² |
|---|---|---|---|---|---|
| Example 1 | 820 | 92.5 | 112 μm | 4.2% | 0.3 |
| Example 2 | 680 | 95.5 | 150 μm | 1.6% | 0.5 |
| Example 3 | 450 | 96 | 180 μm | 2.3% | 1.2 |
| Example 4 | 420 | 97 | 123 μm | 1.9% | 2.5 |
| Example 5 | 460 | 93 | 42 μm | 3.1% | 0.9 |
| Example 6 | 110 | 92 | 96 μm | 1.8% | 0.5 |
| Example 7 | 140 | 97.5 | 52 μm | 3.4% | 0.5 |
| Example 8 | 350 | 95.3 | 65 μm | 1.8% | 2.3 |
| Example 9 | 24 | 96.5 | 290 μm | 3.2% | 1.6 |
| Example 10 | 40 | 100 | 560 μm | 12.5% | 0.6 |
| Comparative Example 1 | 2300 | 96 | 52 μm | 3.0% | 7.8 |
| Comparative Example 2 | 1800 | 96 | 260 μm | 2.8% | 25.1 |
| Comparative Example 3 | 1200 | 88 | 36 μm | 28.6% | 36.3 |
| Comparative Example 4 | 1500 | 98 | 40 μm | 1.5% | 13.3 |
| Comparative Example 5 | 1600 | 97 | 85 μm | 0.8% | 10.2 |

TABLE 3

Unit: ppm

| | Example 1 | Example 4 | Example 10 |
|---|---|---|---|
| C | 26 | 13 | 4 |
| N | 18 | 8 | 1 |
| H | 15 | 9 | 2 |
| S | 1 | 5 | 1 |
| P | 5 | <1 | 1 |
| Cl | 59 | <1 | <1 |
| Mn | 6 | <0.1 | 0.2 |
| Cu | 8 | <1 | 0.3 |
| Al | 3 | <0.5 | 0.3 |
| As | <1 | <1 | <1 |
| B | 0.5 | <1 | <1 |
| Bi | <1 | <1 | <1 |
| Ca | <2 | <1 | <1 |
| Cd | <0.1 | <1 | <1 |
| Co | 16 | 15 | 1 |
| Cr | <0.5 | <0.3 | 0.3 |
| Mg | <0.1 | <1 | <1 |
| Mo | <0.2 | <1 | <1 |
| Pb | 0.5 | <1 | 0.2 |
| Sb | 0.5 | <1 | <1 |
| Sn | 0.3 | <1 | <1 |
| Ti | <0.1 | <1 | <1 |
| V | <0.4 | <1 | <1 |
| W | 0.3 | <1 | <1 |
| Zn | 1.2 | <0.4 | <1 |
| Zr | <1 | <1 | <1 |
| Te | <1 | <1 | <1 |
| Ag | <1 | <1 | <1 |
| Na | <1 | <1 | <1 |
| K | <1 | <1 | <1 |
| U | <0.005 | <0.005 | <0.005 |
| Th | <0.005 | <0.005 | <0.005 |

As shown in Table 2, in the Examples of the present invention, the oxygen content as impurity was low, the relative density was 90% or more, the average crystal grain size was 300 μm or less (excluding the melted target of Example 10), the area ratio of $\zeta_\alpha$ was 70% or more, the evenness (uniformity, 3σ) of the film was favorable, the generation of particles was significantly reduced, and the sputtering characteristics were favorable. Further, as shown in FIG. 3, other impurities were also significantly reduced.

Meanwhile, in each of the Comparative Examples, the oxygen content was high, the ratio of βFeSi₂ was also high, and the target showed significant generation of particles, and a film that could be peeled easily was formed. These problems caused the deterioration of the sputtered deposition quality. Moreover, the peak of βFeSi₂ from the XRD measurement could not be observed from either the Example or Comparative Examples.

The iron silicide sputtering target of the present invention yields a superior effect in that the amount of impurities such as oxygen will be reduced, the thickness of the βFeSi₂ film during deposition can be made thick, the generation of particles will be reduced, a uniform and homogenous film composition can be yielded, and the sputtering characteristics will be favorable. The present invention also yields a superior effect in that such target can be stably manufactured.

The invention claimed is:

1. A sputtering target, comprising an iron silicide magnetron sputtering target having a content of oxygen as a gas component of 1000 ppm or less, a relative density of at least 90%, and a target texture with an average crystal grain size of 300 μm or less, said target texture being substantially a $\zeta_\alpha$ phase, or having a primary phase that is a $\zeta_\alpha$ phase.

2. An iron silicide sputtering target according to claim 1, wherein the content of oxygen as the gas component in the target is 600 ppm or less.

3. An iron silicide sputtering target according to claim 2, wherein the content of oxygen as the gas component in the target is 150 ppm or less.

4. A sputtering target according to claim 3, wherein said gas component of said target includes a content of carbon of 50 ppm or less, a content of nitrogen of 50 ppm or less, a content of hydrogen of 50 ppm or less, and a content of sulfur of 50 ppm or less.

5. A sputtering target according to claim 4, wherein said relative density of said target is at least 95%.

6. A sputtering target according to claim 5, wherein said average crystal grain size is 150 μm or less.

7. A sputtering target according to claim 6, wherein said average crystal grain size is 75 μm or less.

8. A sputtering target according to claim 1, wherein said gas component of said target includes a content of carbon of 50 ppm or less, a content of nitrogen of 50 ppm or less, a content of hydrogen of 50 ppm or less, and a content of sulfur of 50 ppm or less.

9. A sputtering target according to claim 1, wherein said relative density of said target is at least 95%.

10. A sputtering target according to claim 1, wherein said average crystal grain size is 150 μm or less.

11. A sputtering target according to claim 1, wherein said average crystal grain size is 75 μm or less.

12. A method of manufacturing an iron silicide magnetron sputtering target, comprising the steps of melting and casting high purity iron and silicon under high vacuum to prepare an alloy ingot, subjecting the ingot to gas atomization with inert gas to prepare fine powder, and thereafter sintering the fine powder to provide an iron silicide magnetron sputtering target having a content of oxygen as a gas component of 1000 ppm or less, a relative density of at least 90%, and a target texture with an average crystal grain size of 300 μm or less, said target texture being substantially a $\zeta_a$ phase, or having a primary phase that is a $\zeta_a$ phase.

13. A method according to claim 12, wherein the high purity iron and silicon are melted via a cold crucible melting process employing a water-cooled copper crucible.

14. A method according to claim 13, wherein the fine powder is sintered by one of hot pressing, hot isostatic pressing, and spark plasma sintering.

15. A method according to claim 14, wherein, before said sintering step, said fine powder is heated under a hydrogen atmosphere, subjected to decarbonization and deoxidization processing, and subjected to degasification processing under a vacuum atmosphere.

16. A method according to claim 12, wherein the fine powder is sintered by one of hot pressing, hot isostatic pressing, and spark plasma sintering.

17. A method according to claim 12, wherein, before said sintering step, said fine powder is heated under a hydrogen atmosphere, subjected to decarbonization and deoxidization processing, and subjected to degasification processing under a vacuum atmosphere.

18. A sputtering target, comprising:
a magnetron sputtering target body consisting of iron silicide of a single-phase $\zeta_a$ phase such that said sputtering target body is of a structure capable of being subjected to DC magnetron sputtering for forming a $\beta FeSi_2$ thin film on a substrate and such that said sputtering target body enables application of a stable bias current to the sputtering target body during a sputtering operation, enables plasma density to be readily increased during a sputtering operation, and enables sputtering gas pressure to be kept low during a sputtering operation;
said magnetron sputtering target body having a content of oxygen as a gas component of 600 ppm or less and a relative density of at least 95%, and said target texture having an average crystal grain size of 150 μm or less; and
said magnetron sputtering target body being a sintered body having a diameter of 125 to 300 mm and a thickness of 5 mm and having a sputtering face surface ground with a flat-surface grinding machine.

* * * * *